(12) United States Patent
Joo et al.

(10) Patent No.: US 10,121,863 B2
(45) Date of Patent: Nov. 6, 2018

(54) SEMICONDUCTOR DEVICE AND METHOD MANUFACTURING THE SAME

(71) Applicants: Hyundai Motor Company, Seoul (KR); Kia Motors Corporation, Seoul (KR)

(72) Inventors: NackYong Joo, Hanam-si (KR); Youngkyun Jung, Seoul (KR); Junghee Park, Suwon-si (KR); JongSeok Lee, Suwon-si (KR); Dae Hwan Chun, Gwangmyeong-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 15/631,993

(22) Filed: Jun. 23, 2017

(65) Prior Publication Data
US 2018/0166538 A1    Jun. 14, 2018

(30) Foreign Application Priority Data
Dec. 13, 2016    (KR) .......................... 10-2016-0169810

(51) Int. Cl.
*H01L 29/16* (2006.01)
*H01L 29/66* (2006.01)
(Continued)

(52) U.S. Cl.
CPC ...... *H01L 29/1608* (2013.01); *H01L 29/4236* (2013.01); *H01L 29/66015* (2013.01);
(Continued)

(58) Field of Classification Search
CPC ............ H01L 29/1608; H01L 29/7827; H01L 29/4236; H01L 29/66068; H01L 27/2454;
(Continued)

(56) References Cited

U.S. PATENT DOCUMENTS 8,415,739 B2    4/2013   Venkatraman et al.
2003/0075759 A1*  4/2003   Kawano ............. H01L 29/7813
                                                                257/330
(Continued)

FOREIGN PATENT DOCUMENTS

KR    10-2002-0011337 A    2/2002

*Primary Examiner* — Galina Yushina
(74) *Attorney, Agent, or Firm* — Morgan, Lewis & Bockius LLP

(57) ABSTRACT

A semiconductor device may include an n− type layer sequentially disposed at a first surface of an n+ type silicon carbide substrate; a p type region disposed in the n− type layer; an auxiliary n+ type region disposed on the p type region or in the p type region; an n+ type region disposed in the p type region; an auxiliary electrode disposed on the auxiliary n+ type region and the p type region; a gate electrode separated from the auxiliary electrode and disposed on the n− type layer; a source electrode separated from the auxiliary electrode and the gate electrode; and a drain electrode disposed at a second surface of the n+ type silicon carbide substrate, wherein the auxiliary n+ type region and the n+ type region are separated from each other, and the source electrode is in contact with the n+ type region.

17 Claims, 13 Drawing Sheets

(51) Int. Cl.
*H01L 29/78* (2006.01)
*H01L 29/423* (2006.01)

(52) U.S. Cl.
CPC .. *H01L 29/66068* (2013.01); *H01L 29/66712* (2013.01); *H01L 29/7802* (2013.01); *H01L 29/7813* (2013.01); *H01L 29/7827* (2013.01)

(58) Field of Classification Search
CPC ......... H01L 29/66015; H01L 29/66712; H01L 29/7802; H01L 29/7825; H01L 29/55734; H01L 29/7813
See application file for complete search history.

(56) References Cited

U.S. PATENT DOCUMENTS

| | | | |
|---|---|---|---|
| 2009/0283823 A1* | 11/2009 | Izumi | H01L 29/1095 257/332 |
| 2010/0006861 A1* | 1/2010 | Yamamoto | H01L 29/086 257/77 |
| 2012/0104490 A1* | 5/2012 | Yilmaz | H01L 29/407 257/330 |
| 2012/0261746 A1* | 10/2012 | Darwish | H01L 29/1095 257/330 |
| 2016/0172483 A1* | 6/2016 | Chun | H01L 29/66068 257/331 |

* cited by examiner

SEMICONDUCTOR DEVICE AND METHOD MANUFACTURING THE SAME

CROSS-REFERENCE(S) TO RELATED APPLICATIONS

The present application claims priority to Korean Patent Application No. 10-2016-0169810 filed on Dec. 13, 2016, the entire contents of which are incorporated herein for all purposes by this reference.

BACKGROUND OF THE INVENTION

Field of the Invention

The present invention relates to a semiconductor device including a silicon carbide (SiC) and a manufacturing method thereof.

Description of Related Art

A power semiconductor device requires a low on-resistance or a low saturation voltage to reduce a power loss in a conduction state while allowing a particularly large current to flow. Also, a characteristic that can withstand a reverse direction high voltage of a PN junction applied to both ends of the power semiconductor device at an off state or the moment when or a switch is turned off, that is, a high breakdown voltage characteristic, is required.

Among the power semiconductor devices, a metal oxide semiconductor electric field effect transistor (MOSFET) digital circuit and analog circuit are the most common electric field effect transistor.

A concentration and a thickness of an epitaxial layer, or a drift region, of a row material to form the power semiconductor device are determined depending on a rated voltage required by a power system. According to a Poisson equation, as the high breakdown voltage of the power semiconductor device is required, the epitaxial layer, or the drift region, of the low concentration and the thick thickness are needed, however they are causes for increasing an on resistance and reducing a forward direction current density.

The information disclosed in this Background of the Invention section is only for enhancement of understanding of the general background of the invention and should not be taken as an acknowledgement or any form of suggestion that this information forms the prior art already known to a person skilled in the art.

BRIEF SUMMARY

Various embodiments of the present invention relates to a silicon carbide semiconductor device improving the current density.

A semiconductor device according to an exemplary embodiment of the present invention includes an n− type layer disposed at a first surface of an n+ type silicon carbide substrate; a p type region disposed in the n− type layer; an auxiliary n+ type region disposed on the p type region or in the p type region; an n+ type region disposed in the p type region; an auxiliary electrode disposed on the auxiliary n+ type region and the p type region; a gate electrode separated from the auxiliary electrode and disposed on the n− type layer; a source electrode separated from the auxiliary electrode and the gate electrode; and a drain electrode disposed at a second surface of the n+ type silicon carbide substrate, wherein the auxiliary n+ type region and the n+ type region are separated from each other, and the source electrode is in contact with the n+ type region.

The auxiliary electrode may be in contact with the p type region.

The semiconductor device according to an exemplary embodiment of the present invention may further include a first trench disposed at the n− type layer; and a gate insulating layer disposed in the first trench.

The gate electrode may be disposed in the first trench, and the auxiliary n+ type region may be disposed adjacent to the side surface of the first trench.

The p type region may be disposed adjacent to the side surface of the first trench.

The semiconductor device according to an exemplary embodiment of the present invention may further include an insulating layer disposed between the gate electrode and the auxiliary electrode, and the source electrode.

The semiconductor device according to an exemplary embodiment of the present invention may further include a second trench disposed at the n− type layer and separated from the first trench.

The p type region may be disposed adjacent to the side surface of the second trench and may extend below the lower surface of the second trench.

The n+ type region may be disposed under the lower surface of the second trench.

The auxiliary electrode may extend from above the auxiliary n+ type region to the lower surface of the second trench via the side surface of the second trench.

The semiconductor device according to an exemplary embodiment of the present invention may further include a gate insulating layer disposed on the n− type layer, the p type region, and the auxiliary n+ type region.

The gate electrode may be disposed on the gate insulating layer, and the auxiliary electrode may be disposed at the side surface of the gate insulating layer.

A manufacturing method of a semiconductor device according to an exemplary embodiment of the present invention includes forming an n− type layer at a first surface of an n+ type silicon carbide substrate; etching the n− type layer to form a first trench and a second trench; forming a p type region adjacent to a side surface of the second trench and extending to a lower surface of the second trench; forming an auxiliary n+ type region on the p type region and the n− type layer; forming an n+ type region separated from the auxiliary n+ type region and disposed in the p type region; forming an auxiliary electrode on the auxiliary n+ type region; forming a gate insulating layer in the first trench; forming a gate electrode on the gate insulating layer; forming an insulating layer on the gate electrode and the auxiliary electrode; forming a source electrode on the insulating layer and the n+ type region; and forming a drain electrode at a second surface of the n+ type silicon carbide substrate, wherein the auxiliary electrode is separated from the gate electrode and the source electrode, and the source electrode is in contact with the n+ type region.

According to an exemplary embodiment of the present invention, by disposing the gate auxiliary electrode separated from the electrode and the source electrode, when applying a forward direction voltage, the current due to the electron and the current due to the hole flow between the drain electrode and the source electrode by the auxiliary electrode, thereby the current density of the semiconductor device may be improved. Accordingly, as the current density is improved, an area of the semiconductor device may be reduced for the same current amount.

Also, the on resistance of the semiconductor device may be reduced by a flow of the current due to the hole.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
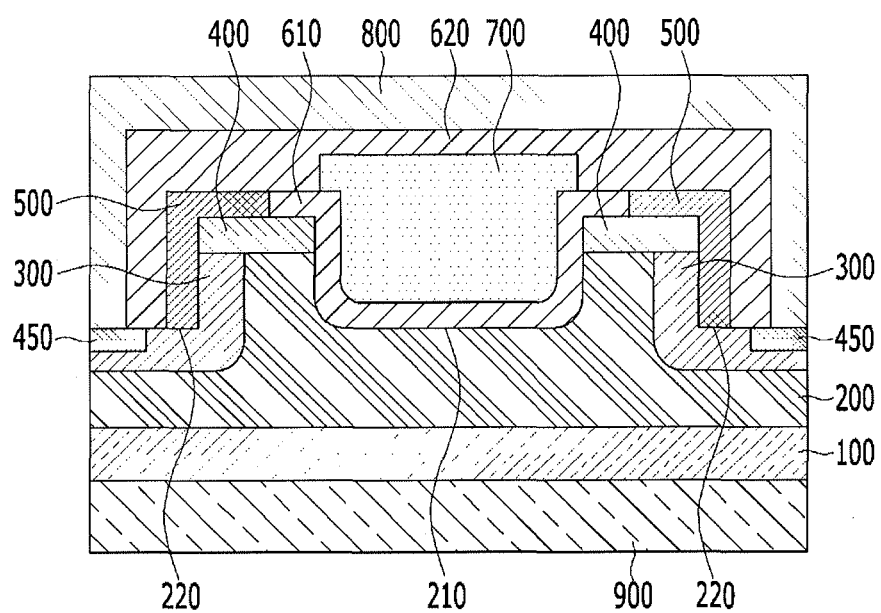
FIG. 1 is a cross-sectional view depicting schematically one example of a semiconductor device according to an exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is intended to cover not only the exemplary embodiments, but also various alternatives, modifications, equivalents and other embodiments, which may be included within the spirit and scope of the invention as defined by the appended claims.

Also, when a layer is referred to as being "on" another layer or substrate, it may be directly formed on another layer or substrate, or a third layer may be interposed between them.

FIG. 1 is a cross-sectional view depicting schematically one example of a semiconductor device according to an exemplary embodiment of the present invention.

Referring to FIG. 1, the semiconductor device according to the present exemplary embodiment includes an n+ type silicon carbide substrate 100, an n− type layer 200, a p type region 300, an auxiliary n+ type region 400, an n+ type region 450, an auxiliary electrode 500, a gate electrode 700, a source electrode 800, and a drain electrode 900.

The n− type layer 200 is disposed at a first surface of the n+ type silicon carbide substrate 100. A first trench 210 and a second trench 220 that are separated from each other are disposed at the n− type layer 200. Depths of the first trench 210 and the second trench 220 may be equal to each other.

The p type region 300 is disposed adjacent to a side surface of the second trench 220 and extends down to a lower surface of the second trench 220. The p type region 300 is not in contact with the side surface of the first trench 210.

The auxiliary n+ type region 400 is disposed on the n− type layer 200, and the p type region 300 and is disposed between the first trench 210 and the second trench 220.

The n+ type region 450 is disposed under the lower surface of the second trench 220 and is disposed in the p type region 300. The n+ type region 450 and the auxiliary n+ type region 400 are separated from each other.

The auxiliary electrode 500 is disposed on the auxiliary n+ type region 400 and extends to the lower surface of the second trench 220 through an inside of the side surface of the second trench 220. That is, the auxiliary electrode 500 is in contact with the auxiliary n+ type region 400 and is in contact with the p type region 300 at the side surface and the lower surface of the second trench 220. The auxiliary electrode 500 is separated from the gate electrode 700, the source electrode 800, and the drain electrode 900. The auxiliary electrode 500 may include an ohmic metal.

The gate insulating layer 610 is disposed in the first trench 210. The gate electrode 700 is disposed on the gate insulating layer 610. The gate insulating layer 610 extends onto the auxiliary n+ type region 400 disposed adjacent to the first trench 210. The gate insulating layer 610 may include silicon oxide ($SiO_2$), and the gate electrode 700 may include a poly-crystalline silicone or a metal.

The insulating layer 620 is disposed on the gate electrode 700 and the auxiliary electrode 500. The insulating layer 620 covers the gate electrode 700. The insulating layer 620 extends to the lower surface of the second trench 220 and covers the auxiliary electrode 500.

The source electrode 800 is disposed on the n+ type region 450, on the insulating layer 620, and in the second trench 220. The source electrode 800 is in contact with the n+ type region 450 at the lower surface of the second trench 220. The drain electrode 900 is disposed at the second surface of the n+ type silicon carbide substrate 100. Here, the source electrode 800 and the drain electrode 900 may include the ohmic metal. Also, the second surface of the n+ type silicon carbide substrate 100 indicates a surface opposite to the first surface of the n+ type silicon carbide substrate 100.

Next, an operation of the semiconductor device according to the present exemplary embodiment will be described with reference to FIG. 2, FIG. 3, and FIG. 4.

Figure 2:
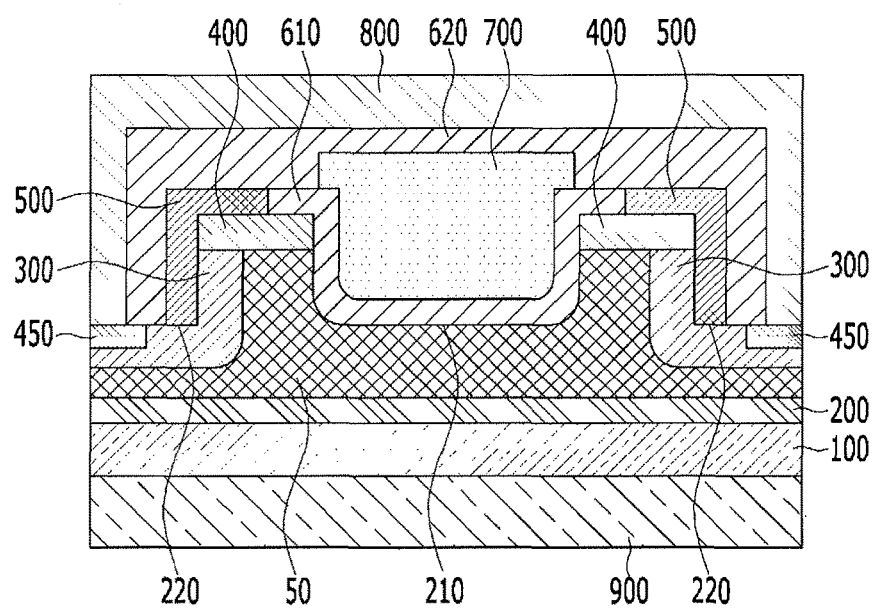
FIG. 2, FIG. 3, and FIG. 4 are views schematically depicting an operation of a semiconductor device according to FIG. 1.
Figure 3:
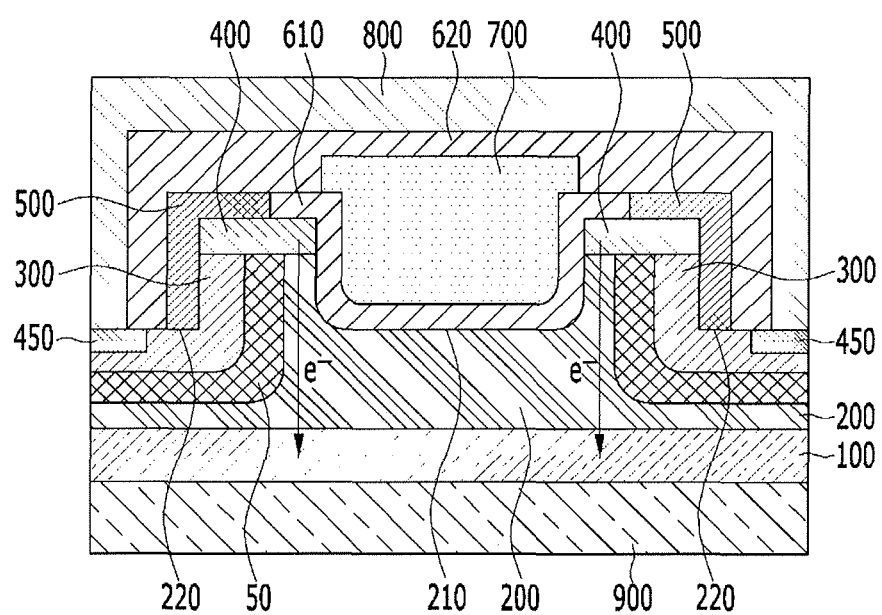
Figure 4:
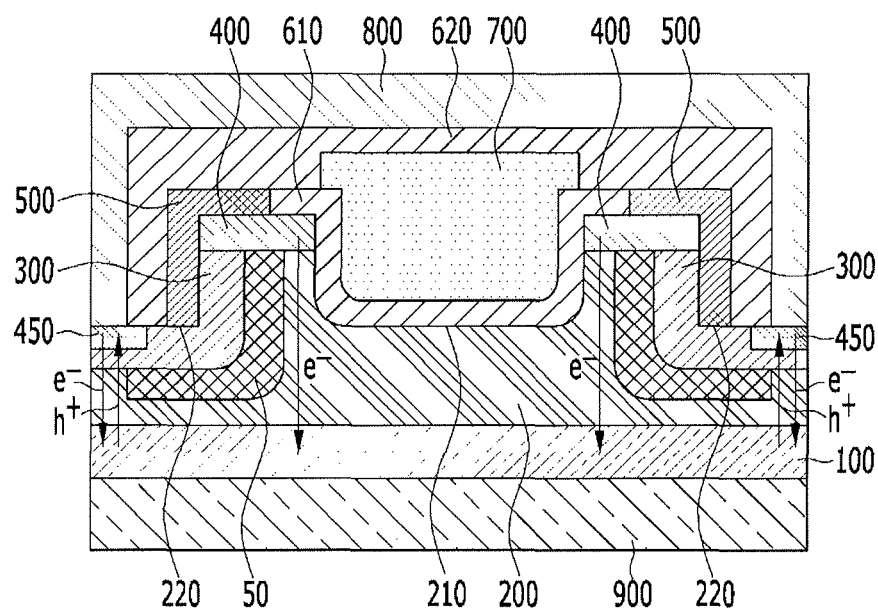

FIG. 2, FIG. 3, and FIG. 4 are views schematically depicting an operation of a semiconductor device according to FIG. 1.

FIG. 2 is a view depicting an off state of the semiconductor device of FIG. 1. FIG. 3 and FIG. 4 are views depicting an on state of the semiconductor device of FIG. 1. FIG. 3 is the view depicting the operation state when the semiconductor device of FIG. 1 operates at less than a knee voltage. FIG. 4 is the view depicting the operation state when the semiconductor device of FIG. 1 operates at more than the knee voltage. The operation of FIG. 3 and the operation of FIG. 4 are performed continuously.

The off state of the semiconductor device is performed in a condition below.

$$V_{GS} < V_{TH}, V_{DS} \geq 0V$$

The operation of the semiconductor device that is less than the knee voltage occurs in a condition below.

$$V_{GS} \geq V_{TH}, 0 < V_{DS} < V_{knee}$$

The operation of the semiconductor device that is more than the knee voltage occurs in a condition below.

$$V_{GS} \geq V_{TH}, V_{DS} \geq V_{knee}$$

Here, $V_{TH}$ is a threshold voltage of the MOSFET, $V_{knee}$ is the knee voltage, $V_{GS}$ is ($V_G-V_S$), and $V_{DS}$ is ($V_D-V_S$). $V_G$ is a voltage applied to the gate electrode, $V_D$ is the voltage applied to the drain electrode, and $V_S$ is the voltage applied to the source electrode.

On the other hand, the voltage is not directly applied to the auxiliary electrode 500.

Referring to FIG. 2, when turning off the semiconductor device, a depletion layer 50 is formed in the n− type layer 200 wherein a flow of the electrons and the current is not generated. The depletion layer 50 encloses the side surface and the lower surface of the first trench 210 and encloses the p type region 300.

Referring to FIG. 3, when the semiconductor device is operated below the knee voltage, compared with the turning off of the semiconductor device, the depletion layer 50 formed under the lower surface of the first trench 210 and the depletion layer 50 formed at the side surface of the first trench 210 are removed. That is, the depletion layer 50 is only formed at the region enclosing the p type region 300.

In the present case, the channel is formed at the n− type layer 200 disposed adjacent to the side surface of the first trench 210, and the electron (e−) moves from the auxiliary n+ type region 400 to the drain electrode 900 through the channel. Accordingly, the current by the electron (e−) flows from the drain electrode 900 to the auxiliary n+ type region 400. The voltage is applied to the auxiliary electrode 500 and the p type region 300 depending on the flow of the current.

Referring to FIG. 4, when the semiconductor device is operated over the knee voltage, compared with the semiconductor device operated below the knee voltage, the partial depletion layer 50 formed under the p type region 300 is removed. That is, the depletion layer 50 is not formed at the part of the portion corresponding to the n+ type region 450.

In the present case, the electron (e−) moves from the source electrode 800 to the drain electrode 900 through the n+ type region 450. Accordingly, the current by the electron (e−) flows from the drain electrode 900 to the source electrode 800.

Also, the hole (h+) moves from the drain electrode 900 to the source electrode 800. Accordingly, the current by the hole (h+) moves from the drain electrode 900 to the source electrode 800.

As described above, when applying the forward direction voltage, the semiconductor device according to the present exemplary embodiment flows the current due to the electron and the current due to the hole flows by the auxiliary electrode 500 between the drain electrode 900 and the source electrode 800, the current density may be improved. As the current density may be improved, an area of the semiconductor device may be reduced for the same current amount.

Also, the on resistance of the semiconductor device may be reduced by the flow of the current by the hole.

Then, characteristics of the semiconductor device according to the present exemplary embodiment and the semiconductor device according to the comparative example are compared with reference to Table 1

The semiconductor device according to the comparative example is the general MOSFET device in which the auxiliary electrode according to the present exemplary embodiment is not applied.

Table 1 shows a simulation result of the semiconductor device according to the present exemplary embodiment and the semiconductor device according to the comparative example.

In Table 1, the current density is compared by almost equaling the breakdown voltages of the semiconductor device according to the present exemplary embodiment and the semiconductor device of the comparative example.

TABLE 1

| | Breakdown voltage (V) | On resistance (mΩcm²) | Current density (A/cm²) | | |
|---|---|---|---|---|---|
| | | | @10 V | @15 V | @20 |
| Comparative example | 1646 | 11.0 | 1170 | 1582 | 1909 |
| Exemplary embodiment | 1640 | 6.9 | 1114 | 1779 | 2307 |

Referring to Table 1, the on resistance of the semiconductor device according to the comparative example appears as 11.0 mΩcm2, and the on resistance of the semiconductor device according to the present exemplary embodiment appears as 6.9 mΩcm2. The results may be confirmed that the on resistance of the semiconductor device according to the present exemplary embodiment is reduced by about 37% for the on resistance of the semiconductor device according to comparative example.

In the case of the current density, the results may be confirmed that the semiconductor device according to the comparative example and the semiconductor device according to the present exemplary embodiment are the almost same at 10V, and the semiconductor device according to the present exemplary embodiment is larger than the semiconductor device according to the comparative example at 15V and 20V.

Next, a manufacturing method of the semiconductor device according to an exemplary embodiment of the present invention will be described with reference to FIG. 1 and FIG. 5, FIG. 6, FIG. 7, FIG. 8, FIG. 9 and FIG. 10.

FIG. 5, FIG. 6, FIG. 7, FIG. 8, FIG. 9 and FIG. 10 are views schematically depicting one example of a manufacturing method of a semiconductor device according to an exemplary embodiment of the present invention.

Figure 5:
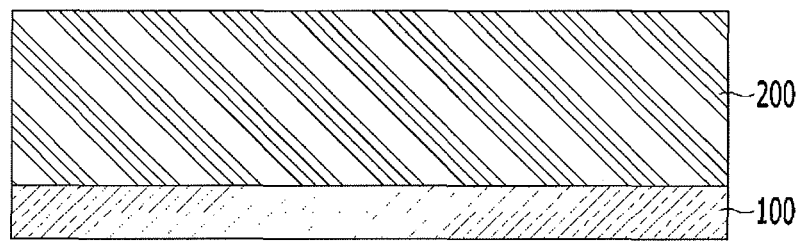
FIG. 5, FIG. 6, FIG. 7, FIG. 8, FIG. 9 and FIG. 10 are views schematically depicting one example of a manufacturing method of a semiconductor device according to an exemplary embodiment of the present invention.

Referring to FIG. 5, an n+ type silicon carbide substrate 100 is prepared, and an n− type layer 200 is formed at a first surface of the n+ type silicon carbide substrate 100 by an epitaxial growth.

Figure 6:
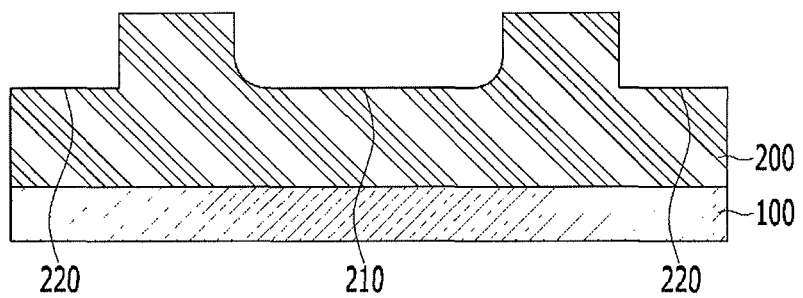

Referring to FIG. 6, the n− type layer 200 is etched to form a first trench 210 and a second trench 220 that are separated from each other. In the present case, the first trench 210 and the second trench 220 may be simultaneously formed.

Figure 7:
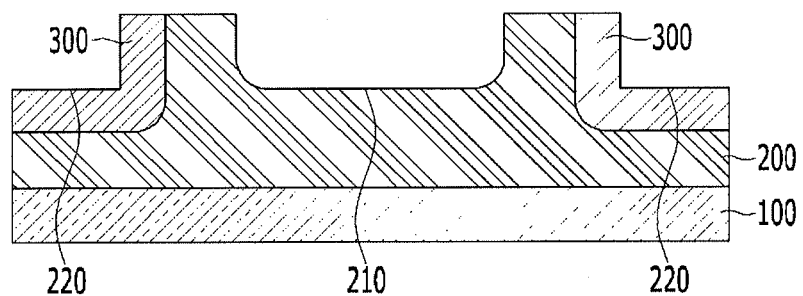

Referring to FIG. 7, p type ions including boron (B), aluminum (Al), gallium (Ga), and indium (In) are injected to the side surface and the lower surface of the second trench 220 to form a p type region 300. Accordingly, the p type region 300 is disposed adjacent to the side surface of the second trench 220 and extends below the lower surface of the second trench 220.

Figure 8:
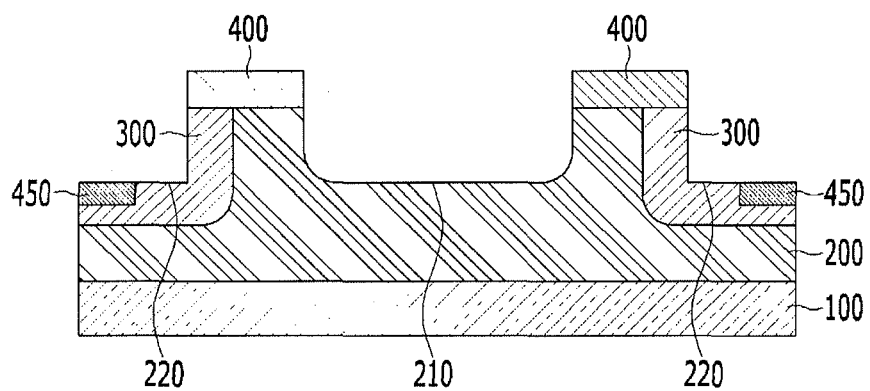

Referring to FIG. 8, n type ions including nitrogen (N), phosphorus (P), arsenic (As), and antimony (Sb) etc. are injected to the p type region 300 and the n− type layer 200 to form an auxiliary n+ type region 400 and an n+ type region 450 that are separated from each other. The auxiliary n+ type region 400 is formed on the p type region 300 and the n− type layer 200 that are disposed between the first trench 210 and the second trench 220. The n+ type region 450 is formed in the p type region 300 disposed under the lower surface of the second trench 220.

Figure 9:
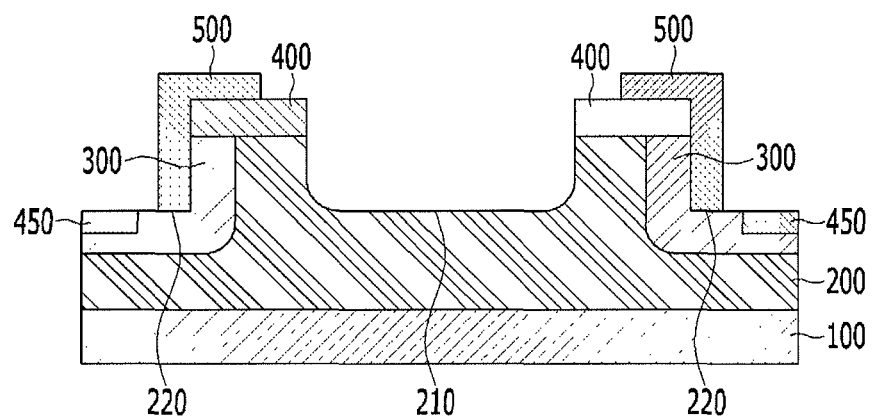

Referring to FIG. 9, an auxiliary electrode 500 is formed on the auxiliary n+ type region 400. The auxiliary electrode 500 extends to the lower surface of the second trench 220 through an inside of the side surface of the second trench 220 on the auxiliary n+ type region 400. Accordingly, the auxiliary electrode 500 is in contact with the p type region 300 at the side surface and the lower surface of the second trench 220.

Figure 10:
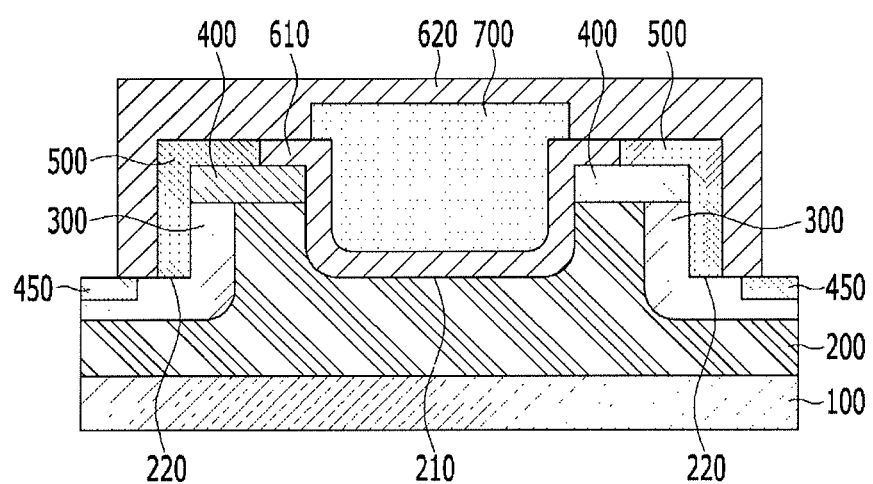

Referring to FIG. 10, after a gate insulating layer 610 is formed at the first trench 210, a gate electrode 700 is formed on the gate insulating layer 610, and then an insulating layer 620 is formed on the gate electrode 700 and the auxiliary electrode 500.

Referring to FIG. 1, a source electrode 800 is formed on the insulating layer 620 and the n+ type region 450, and a drain electrode 900 is formed at the second surface of the n+ type silicon carbide substrate 100.

On the other hand, in the manufacturing method of the semiconductor device according to the present exemplary embodiment, after the first trench 210 and the second trench 220 are simultaneously formed, the p type region 300 is formed, however it is not limited thereto and the first trench 210 and the second trench 220 may be respectively formed. For example, after the first trench 210 may be firstly formed, the second trench 220 may be formed and then the p type region 300 may be formed, or after the second trench 220 may be firstly formed, the p type region 300 may be formed and then the first trench 210 may be formed.

On the other hand, the auxiliary electrode may be applied to the semiconductor device of various structures as well as the structure of the semiconductor device according to the present exemplary embodiment. These will be described with reference to FIG. 11, FIG. 12, and FIG. 13.

Figure 11:
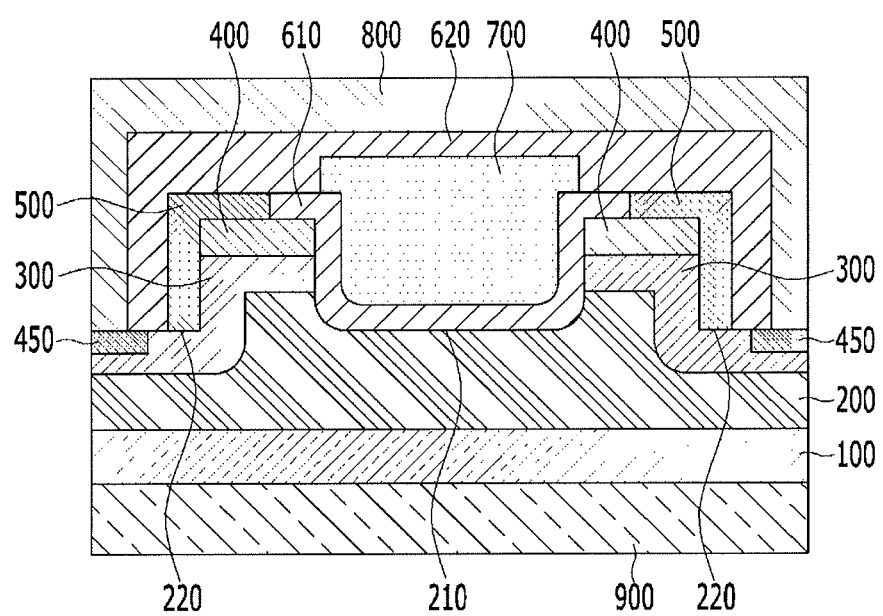
FIG. 11, FIG. 12, and FIG. 13 are cross-sectional views schematically depicting one example of a semiconductor device according to an exemplary embodiment of the present invention.
Figure 12:
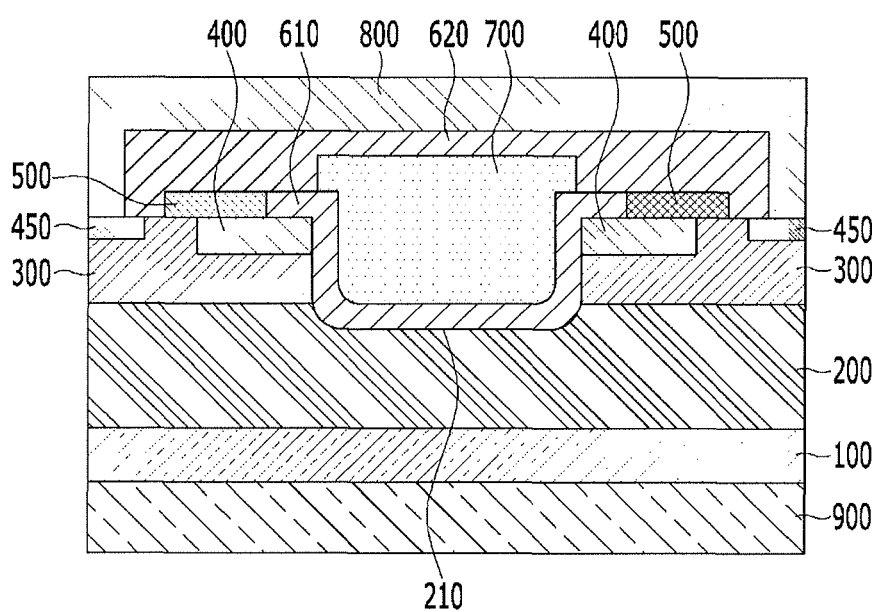
Figure 13:
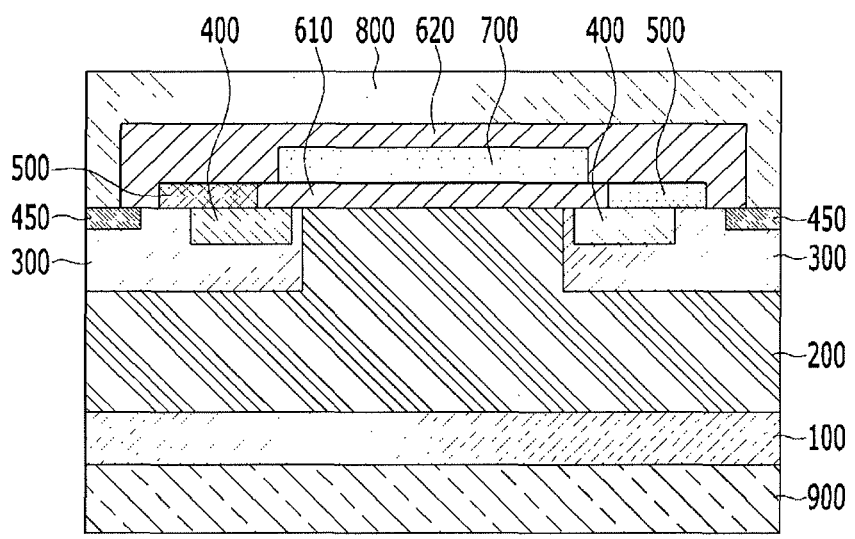

FIG. 11, FIG. 12, and FIG. 13 are cross-sectional views schematically depicting one example of a semiconductor device according to an exemplary embodiment of the present invention, respectively.

Referring to FIG. 11, the semiconductor device according to the present exemplary embodiment is the same as the semiconductor device according to FIG. 1 except for a shape of the p type region 300. Accordingly, the description for the same structure is omitted.

The p type region 300 is disposed adjacent to the side surface of the second trench 220 and extends below the lower surface of the second trench 220. Also, the p type region 300 is disposed adjacent to the side surface of the first trench 210. Accordingly, in the on operation of the semiconductor device according to the present exemplary embodiment, the channel is formed at the p type region 300 disposed adjacent to the side surface of the first trench 210.

Referring to FIG. 12, in the semiconductor device according to the present exemplary embodiment, the second trench 220 does not exist compared with the semiconductor device according to FIG. 1.

The p type region 300 is disposed on the n− type layer 200 and is disposed adjacent to the side surface of the first trench 210, and the n+ type region 450 and the auxiliary n+ type region 400 are separated from each other and are disposed in the p type region 300. The auxiliary n+ type region 450 is disposed adjacent to the side surface of the first trench 210.

The auxiliary electrode 500 is disposed on the auxiliary n+ type region 400 and the p type region 300. The auxiliary electrode 500 is in contact with the upper surface of the p type region 300. The rest of the structure is the same as the structure of the semiconductor device according to FIG. 1. The description for the same structure is omitted.

In the on operation of the semiconductor device according to the present exemplary embodiment, the channel is formed at the p type region 300 disposed adjacent to the side surface of the first trench 210.

Referring to FIG. 13, in the semiconductor device according to the present exemplary embodiment, the first trench 210 and the second trench 220 do not exist compared with the semiconductor device according to FIG. 1.

Next, the structure of the semiconductor device will be described in detail.

The semiconductor device according to the present exemplary embodiment includes an n+ type silicon carbide substrate 100, an n− type layer 200, a p type region 300, an auxiliary n+ type region 400, an n+ type region 450, an auxiliary electrode 500, a gate electrode 700, a source electrode 800, and a drain electrode 900.

The n− type layer 200 is disposed at the first surface of the n+ type silicon carbide substrate 100, and the p type region 300 is disposed upward in the n− type layer 200. The auxiliary n+ type region 400 and the n+ type region 450 are separated from each other and are disposed upward in the p type region 300.

The gate insulating layer 610 is disposed on the n− type layer 200, the p type region 300, and the auxiliary n+ type region 400, and the gate electrode 700 is disposed on the gate insulating layer 610.

The auxiliary electrode 500 is disposed at the side surface of the gate insulating layer 610. The auxiliary electrode 500 is disposed on the auxiliary n+ type region 400 and the p type region 300. The auxiliary electrode 500 is separated from the gate electrode 700, the source electrode 800, and the drain electrode 900. The auxiliary electrode 500 is in contact with the upper surface of the p type region 300.

The insulating layer 620 is disposed on the gate electrode 700 and the auxiliary electrode 500. The insulating layer 620 covers the side surface of the gate electrode 700.

The source electrode 800 is disposed on the n+ type region 450 and on the insulating layer 620. The source electrode 800 is in contact with the n+ type region 450. The drain electrode 900 is disposed at the second surface of the n+ type silicon carbide substrate 100. Here, the source electrode 800 and the drain electrode 900 may include the ohmic metal. Also, the second surface of the n+ type silicon carbide substrate 100 indicates the surface opposite to the first surface of the n+ type silicon carbide substrate 100.

In the on operation of the semiconductor device according to the present exemplary embodiment, the channel is formed at the p type region 300 disposed under the gate electrode 700.

For convenience in explanation and accurate definition in the appended claims, the terms "upper", "lower", "internal", "outer", "up", "down", "upwards", "downwards", "front", "rear", "back", "inside", "outside", "inwardly", "outwardly", "internal", "external", "forwards", and "backwards" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described to explain certain principles of the invention and their practical application, to enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A semiconductor device comprising:
    an n− type layer disposed at a first surface of an n+ type silicon carbide substrate;
    a p type region disposed in the n− type layer;
    an auxiliary n+ type region disposed on the p type region or in the p type region;
    an n+ type region disposed in the p type region;
    an auxiliary electrode disposed on the auxiliary n+ type region and the p type region;
    a gate electrode separated from the auxiliary electrode and disposed on the n− type layer;
    a source electrode separated from the auxiliary electrode and the gate electrode; and
    a drain electrode disposed at a second surface of the n+ type silicon carbide substrate,
    wherein the auxiliary n+ type region and the n+ type region are separated from each other, and
    the source electrode is in contact with the n+ type region.

2. The semiconductor device of claim 1, wherein the auxiliary electrode is in contact with the p type region.

3. The semiconductor device of claim 2, further including:
    a first trench disposed at the n− type layer; and
    a gate insulating layer disposed in the first trench.

4. The semiconductor device of claim 3, wherein the gate electrode is disposed in the first trench, and the auxiliary n+ type region is disposed adjacent to a side surface of the first trench.

5. The semiconductor device of claim 4, wherein the p type region is disposed adjacent to the side surface of the first trench.

6. The semiconductor device of claim 5, further including:
    an insulating layer disposed between the gate electrode and the auxiliary electrode, and the source electrode.

7. The semiconductor device of claim 6, further including:
    a second trench disposed at the n− type layer and separated from the first trench.

8. The semiconductor device of claim 7, wherein the p type region is disposed adjacent to a side surface of the second trench and extends below a lower surface of the second trench.

9. The semiconductor device of claim 8, wherein the n+ type region is disposed under the lower surface of the second trench.

10. The semiconductor device of claim 9, wherein the auxiliary electrode extends from above the auxiliary n+ type region to the lower surface of the second trench via the side surface of the second trench.

11. The semiconductor device of claim 1, further including:
    a gate insulating layer disposed on the n− type layer, the p type region, and the auxiliary n+ type region.

12. The semiconductor device of claim 11, wherein the gate electrode is disposed on the gate insulating layer, and the auxiliary electrode is disposed at a side surface of the gate insulating layer.

13. The semiconductor device of claim 1, further including:
    an insulating layer disposed between the gate electrode and the auxiliary electrode, and the source electrode.

14. A method for manufacturing a semiconductor device comprising:
    forming an n− type layer at a first surface of an n+ type silicon carbide substrate;
    etching the n− type layer to form a first trench and a second trench thereon;
    forming a p type region adjacent to a side surface of the second trench and extending to a lower surface of the second trench;
    forming an auxiliary n+ type region on the p type region and the n− type layer;
    forming an n+ type region separated from the auxiliary n+ type region and disposed in the p type region;
    forming an auxiliary electrode on the auxiliary n+ type region;
    forming a gate insulating layer in the first trench;
    forming a gate electrode on the gate insulating layer;
    forming an insulating layer on the gate electrode and the auxiliary electrode;
    forming a source electrode on the insulating layer and the n+ type region; and
    forming a drain electrode at a second surface of the n+ type silicon carbide substrate,
    wherein the auxiliary electrode is separated from the gate electrode and the source electrode, and
    wherein the source electrode is in contact with the n+ type region,
    wherein the semiconductor device includes:
        the n− type layer disposed at the first surface of the n+ type silicon carbide substrate;
        the p type region disposed in the n− type layer;
        the auxiliary n+ type region disposed on the p type region or in the p type region;
        the n+ type region disposed in the p type region;
        the auxiliary electrode disposed on the auxiliary n+ type region and the p type region;
        the gate electrode separated from the auxiliary electrode and disposed on the n− type layer;
        the source electrode separated from the auxiliary electrode and the gate electrode; and
        the drain electrode disposed at the second surface of the n+ type silicon carbide substrate,
        wherein the auxiliary n+ type region and the n+ type region are separated from each other, and
        the source electrode is in contact with the n+ type region.

15. The method of claim 14, wherein the auxiliary electrode is in contact with the p type region.

16. The method of claim 15, wherein the n+ type region is disposed under the lower surface of the second trench.

17. The method of claim 16, wherein the auxiliary electrode extends from above the auxiliary n+ type region to the lower surface of the second trench via the side surface of the second trench.

* * * * *